United States Patent
Aygun et al.

(10) Patent No.: US 11,887,932 B2
(45) Date of Patent: Jan. 30, 2024

(54) DIELECTRIC-FILLED TRENCH ISOLATION OF VIAS

(71) Applicant: INTEL CORPORATION, Santa Clara, CA (US)

(72) Inventors: Kemal Aygun, Tempe, AZ (US); Zhiguo Qian, Chandler, AZ (US); Jianyong Xie, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/684,163

(22) Filed: Mar. 1, 2022

(65) Prior Publication Data
US 2022/0270974 A1    Aug. 25, 2022

Related U.S. Application Data

(62) Division of application No. 16/769,548, filed as application No. PCT/US2018/025519 on Mar. 30, 2018, now Pat. No. 11,296,031.

(51) Int. Cl.
*H01L 23/538* (2006.01)
*H01L 21/762* (2006.01)
*H01L 25/065* (2023.01)
*H01L 29/06* (2006.01)
*H01L 21/765* (2006.01)

(52) U.S. Cl.
CPC ........ *H01L 23/5384* (2013.01); *H01L 21/765* (2013.01); *H01L 21/76283* (2013.01); *H01L 25/0655* (2013.01); *H01L 29/0649* (2013.01)

(58) Field of Classification Search
CPC ............. H01L 23/5384; H01L 25/0655; H01L 21/765; H01L 29/0649; H01L 23/552; H01L 21/76283
USPC .......................... 257/774, 773; 438/629, 637
See application file for complete search history.

(56) References Cited

U.S. PATENT DOCUMENTS

| 2005/0212071 A1 | 9/2005 | Yue et al. |
| 2012/0104561 A1 | 5/2012 | Kuo |
| 2014/0220760 A1 | 8/2014 | Bachman et al. |

(Continued)

OTHER PUBLICATIONS

International Preliminary Report on Patentability for PCT Application No. PCT/US18/25519, dated Oct. 15, 2020.

(Continued)

*Primary Examiner* — Thinh T Nguyen
(74) *Attorney, Agent, or Firm* — Essential Patents Group, LLP

(57) ABSTRACT

An apparatus is provided which comprises: a substrate, the substrate comprising crystalline material, a first set of one or more contacts on a first substrate surface, a second set of one or more contacts on a second substrate surface, the second substrate surface opposite the first substrate surface, a first via through the substrate coupled with a first one of the first set of contacts and with a first one of the second set of contacts; a second via through the substrate coupled with a second one of the first set of contacts and with a second one of the second set of contacts, a trench in the substrate from the first substrate surface toward the second substrate surface, wherein the trench is apart from, and between, the first via and the second via, and dielectric material filling the trench. Other embodiments are also disclosed and claimed.

10 Claims, 11 Drawing Sheets

(56) References Cited

U.S. PATENT DOCUMENTS

| | | |
|---|---|---|
| 2015/0011083 A1 | 1/2015 | Tsai et al. |
| 2016/0079169 A1* | 3/2016 | Uzoh et al. |
| 2020/0219775 A1* | 7/2020 | Pang et al. ...... H01L 21/823821 |
| 2020/0294901 A1* | 9/2020 | Strong et al. ..... H01L 23/49836 |

OTHER PUBLICATIONS

International Search Report and Written Opinion for International Patent Application No. PCT/US18/25519, dated Dec. 20, 2018.
Notice of Allowance for U.S. Appl. No. 16/769,548, dated Dec. 15, 2021.
Office Action for U.S. Appl. No. 16/769,548, dated Aug. 12, 2021.
Restriction Requirement for U.S. Appl. No. 16/769,548, dated Apr. 21, 2021.

* cited by examiner

DIELECTRIC-FILLED TRENCH ISOLATION OF VIAS

CLAIM OF PRIORITY

This application is a Divisional of U.S. patent application Ser. No. 16/769,548, filed on Jun. 3, 2020 and titled "DIELECTRIC-FILLED TRENCH ISOLATION OF VIAS", which is a National Stage Entry of, and claims priority to, PCT Application No. PCT/US2018/025519, filed on Mar. 30, 2018 and titled "DIELECTRIC-FILLED TRENCH ISOLATION OF VIAS", which is incorporated by reference in its entirety for all purposes.

BACKGROUND

In semiconductor device packaging, the use of interposers has become more prevalent, not only to couple and/or stack multiple integrated circuit devices into a single package, but also to transpose a fine contact pitch of a device to a more relatively coarse contact pitch, for example, for coupling with a package substrate.

Interposers typically rely on advanced semiconductor processing methods and often include a substrate of semiconductor material. Vias, such as a through-silicon via or through-chip via, are vertical electrical connections formed through semiconductor material, including interposer substrates. As the number of contacts on devices coupled with an interposer increases, the density of vias would need to increase to maintain or reduce the footprint of the device package. Increasing density, and scaling down dimensions, of vias can lead to issues such as signal loss into the semiconductor material or crosstalk among nearby vias. Signal loss may result from isolation capacitance of via and pad as well as the conductivity of the semiconductor substrate. Effects of crosstalk may vary depending upon the signal frequency and conductivity of the substrate. For example, for a silicon substrate with conductivity of about 10 S/m, the conductive coupling may be significant for signals with frequencies between about 100 MHz and 1 GHz.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
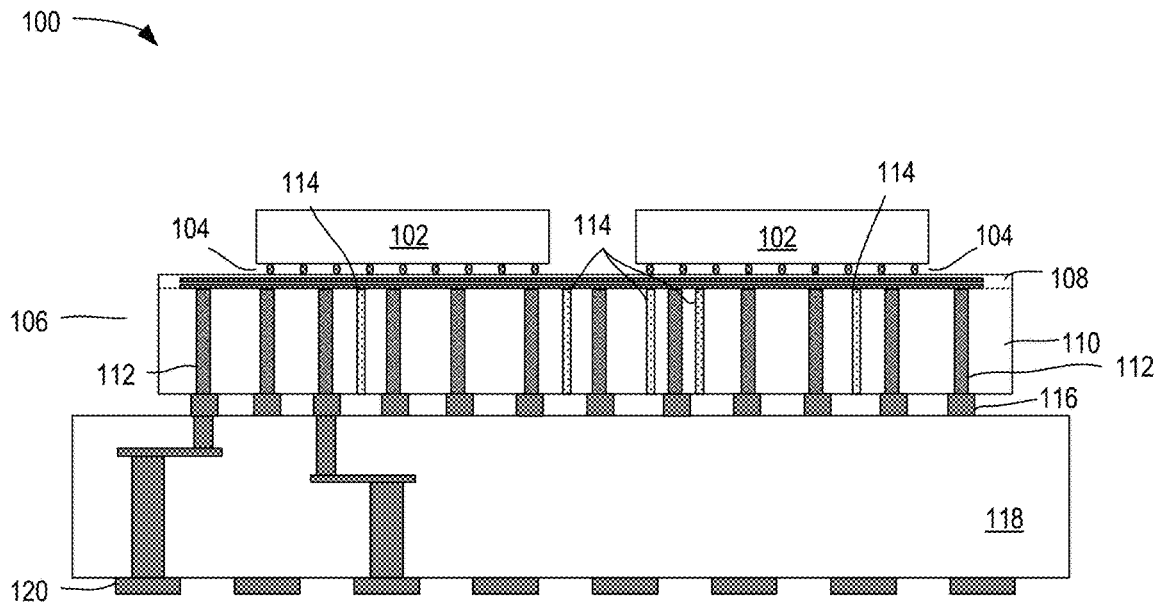
FIG. 1 illustrates a cross-sectional view of an example integrated circuit device package including dielectric-filled trench isolation of vias, according to some embodiments.

Dielectric-filled trench isolation of vias is generally presented. In this regard, embodiments of the present disclosure enable insulating dielectric walls through a semiconductor substrate between, and apart from, vias. Dielectric walls may surround individual or multiple vias. One skilled in the art would appreciate that this approach may enable higher density interposers by providing mitigation for issues such as signal loss and crosstalk.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates a cross-sectional view of an example integrated circuit device package including dielectric-filled trench isolation of vias, according to some embodiments. As shown, integrated circuit device package 100 includes devices 102, device contacts 104, interposer 106, interposer interconnects 108, interposer substrate 110, vias 112, dielectric-filled trenches 114, interposer contacts 116, package substrate 118, and package substrate contacts 120. While shown as including two devices 102, in some embodiments integrated circuit device package 100 may include any number of homogenous or heterogeneous devices in any arrangement, including 3D stacking. In some embodiments, devices 102 may include processors, controllers, memory devices, or other integrated circuit devices.

As shown in more detail hereinafter, interposer 106 may include interposer interconnects 108 and interposer substrate 110. Interposer interconnects 108 may include metal traces within dielectric material, such as interlayer dielectric, to route, and potentially fanout, between device contacts 104 and interposer contacts 116 from a relatively fine contact pitch to a relatively coarse contact pitch. In some embodiments, device contacts 104 and/or interposer contacts 116 may represent controlled collapse chip connection (C4) bumps.

Interposer substrate 110 may represent a semiconductor or other crystalline material. In some embodiments, interposer substrate 110 may comprise silicon, however, in other embodiments, interposer substrate 110 may comprise germanium, gallium arsenide, or other elemental or compound semiconductors. Interposer substrate may include any number of vertical vias 112, of any known structure or variety. In some embodiments, vias 112 may represent through-silicon vias (TSVs).

Dielectric-filled trenches 114 may be selectively formed, as shown in more detail hereinafter, between some of vias 112 to help mitigate signal loss or crosstalk, for example. While shown as including vertical sidewalls, dielectric-filled trenches 114 may include sloped or slanted sidewalls. Dielectric-filled trenches 114 may include any material that may be less conductive than interposer substrate 110, including potentially other semiconductor material. In some embodiments, dielectric-filled trenches 114 may include silicon dioxide, polymers, air, or even a vacuum.

In some embodiments, package substrate 118 may include fiberglass or other dielectric material with metal traces formed on various layers to route, and potentially fanout, between interposer contacts 116 and package substrate contacts 120 from a relatively fine contact pitch to a relatively coarse contact pitch. In some embodiments, package substrate contacts 120 may represent solder balls or bumps for attachment to a system board, for example.

Figure 2:
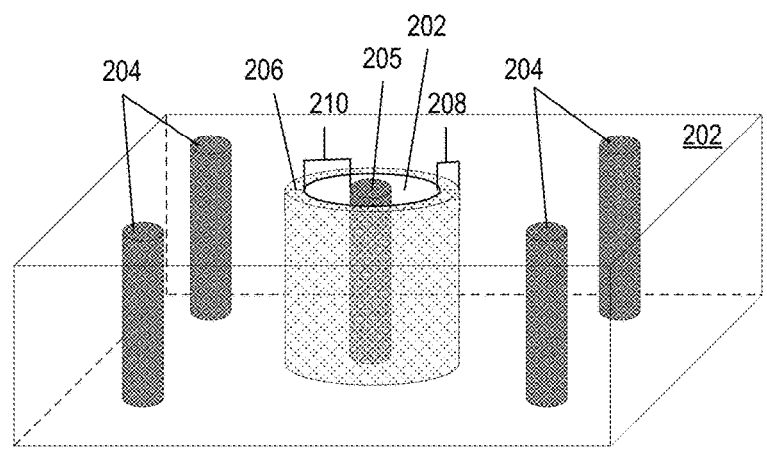
FIG. 2 illustrates a perspective view of an example interposer substrate including dielectric-filled trench isolation of vias, according to some embodiments.

FIG. 2 illustrates a perspective view of an example interposer substrate including dielectric-filled trench isolation of vias, according to some embodiments. As shown, interposer substrate 200 includes semiconductor material 202, vias 204 and 205, dielectric-filled trench 206, trench width 208, and trench spacing 210. While shown as surrounding via 205, dielectric-filled trench 206 may also surround one or more of vias 204.

Vias 204 and 205 may include multiple materials (not shown for clarity). For example, vias 204 and 205 may include a metal conductive center surrounded by a thin dielectric liner. In some embodiments, a dielectric liner of vias 204 and 205 may not be thick enough to prevent signal loss and/or crosstalk within semiconductor material 202.

While shown as being ring-shaped, in some embodiments dielectric-filled trench 206 may be square, oval, or any other shape. In some embodiments, dielectric-filled trench 206 may not completely encircle via 205, as shown, and may instead include gaps or openings. While shown as being concentric with via 205, in some embodiments dielectric-filled trench 206 is non-concentric with via 205.

In some embodiments, dielectric-filled trench 206 may have a trench width 208 that is less than the diameter of via 205. In some embodiments, trench width 208 may be between about 8 and 12 um. Trench spacing 210 may be uniform or varying and there may be as much semiconductor material 202 between dielectric-filled trench 206 and via 205 as there is between vias 204. In some embodiments, trench spacing 210 may be 30 um or more.

Figure 3:
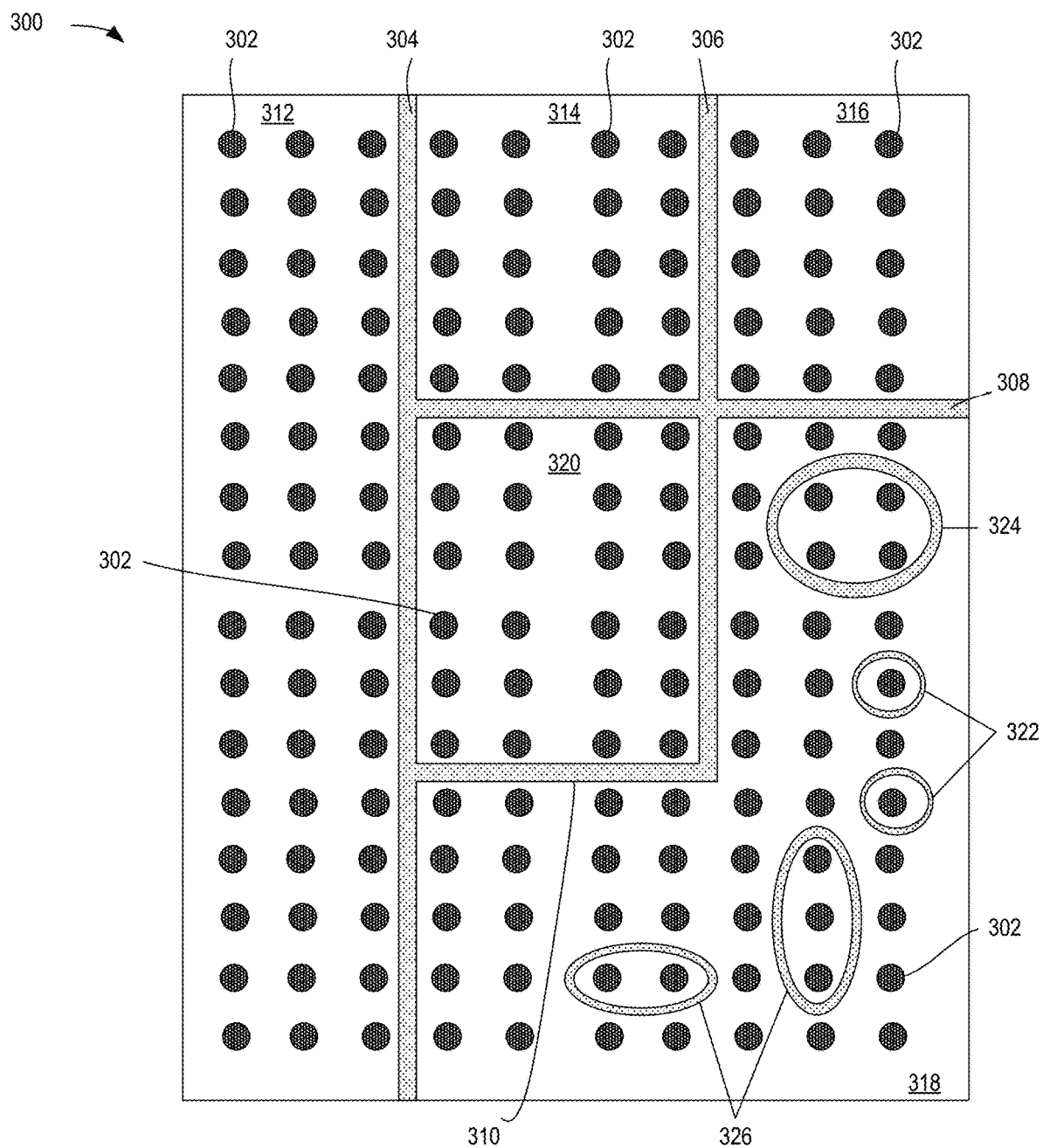
FIG. 3 illustrates a plan view of an example interposer substrate including dielectric-filled trench isolation of vias, according to some embodiments.

FIG. 3 illustrates a plan view of an example interposer substrate including dielectric-filled trench isolation of vias, according to some embodiments. As shown, interposer substrate 300 includes vias 302, straight dielectric-filled trenches 304, 306, 308, and 310, via regions 312, 314, 316, 318, and 320, and cured dielectric-filled trenches 322, 324, and 326. In some embodiments, straight dielectric-filled trenches 304, 306, 308, and 310 may isolate groups of vias 302 and form via regions 312, 314, 316, 318, and 320. In some embodiments, more or fewer via regions may be formed. In some embodiments, via regions may be designed based on the type of signals being sent through the vias. For example, in some embodiments, vias that transmit power may be co-located and collectively isolated by straight or curved dielectric-filled trenches. In some embodiments, clock signals or differential signals may be individually or collectively isolated by straight or curved dielectric-filled trenches.

While shown as running parallel with sides of interposer substrate 300, straight dielectric-filled trenches 304, 306, 308, and 310 may also occur at any angle. In some embodiments, straight dielectric-filled trench 304 may extend perpendicularly from one side of interposer substrate 300 across to the opposite side. In some embodiments, straight dielectric-filled trench 306 may extend perpendicularly from one side of interposer substrate 300 to an intersection with straight dielectric-filled trench 310. In some embodiments, straight dielectric-filled trench 308 may extend perpendicularly from one side of interposer substrate 300 to straight dielectric-filled trench 304. In some embodiments, straight dielectric-filled trench 310 may extend perpendicularly between straight dielectric-filled trenches 304 and 306.

In some embodiments, via region 312 may be insulated from the remainder of interposer substrate 300 by straight dielectric-filled trench 304. In some embodiments, via region 314 may be insulated from the remainder of interposer substrate 300 by straight dielectric-filled trenches 304, 306, and 308. In some embodiments, via region 316 may be insulated from the remainder of interposer substrate 300 by straight dielectric-filled trenches 306 and 308. In some embodiments, via region 318 may be insulated from the remainder of interposer substrate 300 by straight dielectric-filled trenches 304, 306, 308, and 310. In some embodiments, via region 320 may be insulated from the remainder of interposer substrate 300 by straight dielectric-filled trenches 304, 306, 308, and 310.

In some embodiments, curved dielectric-filled trenches may further insulate select via(s) 302 within a via region. While shown as isolating vias 302 in via region 318, curved dielectric-filled trenches may occur in any or all via regions of interposer substrate 300. In some embodiments, curved dielectric-filled trenches 322 may insulate individual vias 302. In some embodiments, curved dielectric-filled trench 324 may have a circular profile and may insulate multiple vias 302. In some embodiments, curved dielectric-filled trenches 326 may have an oval profile and may insulate a linearly-arranged grouping of vias 302.

Figure 4A:
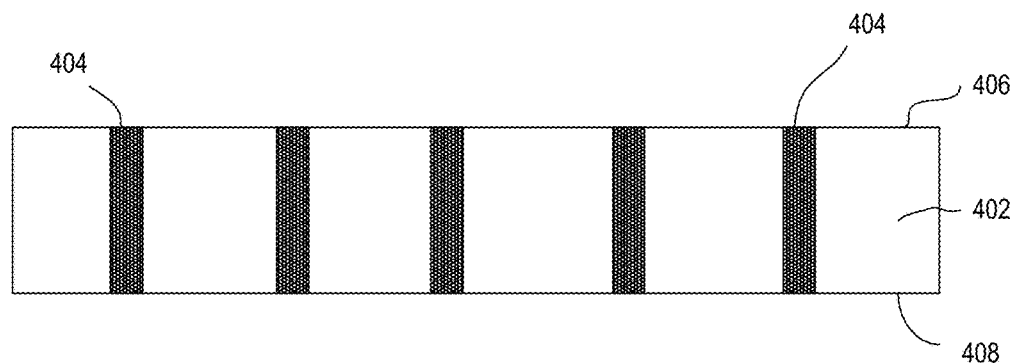
FIGS. 4A-4F illustrate cross-sectional views of manufacturing steps of an example integrated circuit device package including dielectric-filled trench isolation of vias, according to some embodiments.

FIGS. 4A-4F illustrate cross-sectional views of manufacturing steps of an example integrated circuit device package including dielectric-filled trench isolation of vias, according to some embodiments. As shown in FIG. 4A, assembly 400 includes interposer substrate 402, vias 404, interposer substrate top surface 406, and interposer substrate bottom surface 408. In some embodiments, interposer substrate 402 is made from silicon, germanium, or other crystalline material. In some embodiments, vias 404 may be formed by any known technique, including, but not limited to, laser drilling. Also, in addition to conductive material, vias 404 may include additional layers not shown, such as a dielectric liner, for example. While shown as extending from interposer substrate top surface 406 to interposer substrate bottom surface 408, in some embodiments, vias 404 don't initially extend so far and are exposed to the surfaces at a later processing step.

Figure 4B:
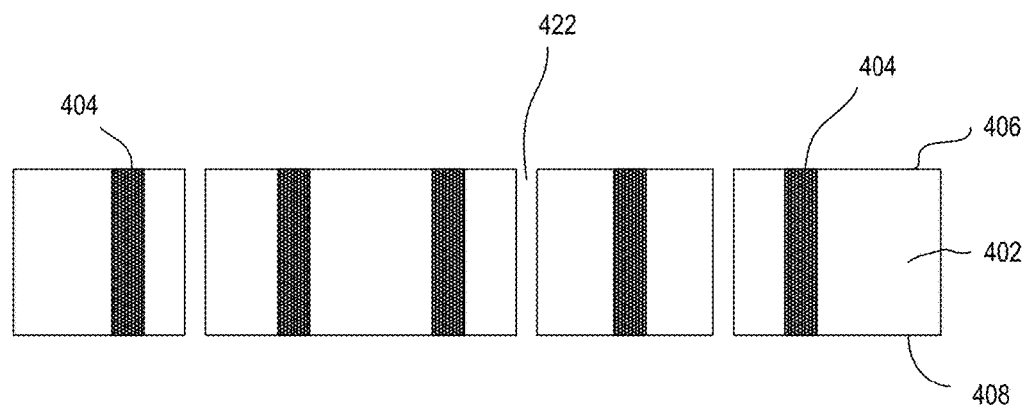

FIG. 4B shows assembly 420, which may include trenches 422 formed into (and in some embodiments through) interposer substrate 402 between vias 404. In some embodiments, one or more trenches 422 may be equidistant from adjacent vias 404, while other trenches 422 may be more proximate to one via 404 than an adjacent via 404. Trenches 422 may be formed by any known technique, including, but not limited to, laser or chemical ablation.

Figure 4C:
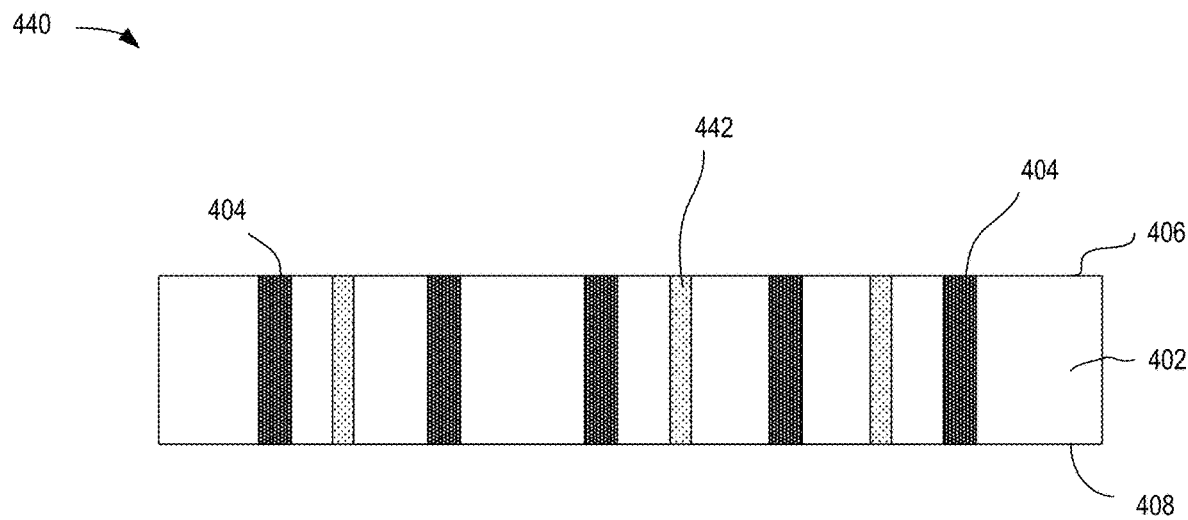

As shown in FIG. 4C, assembly 440 may have had trenches 422 filled with dielectric material 442. In some embodiments, dielectric material 442 may be polymer, including, but not limited to, a polyvinylchloride, polyethylene oxide, or polyethylene terephthalate, that is dispensed as a liquid and subsequently cured. In some embodiments, dielectric material 442 may be a compound, such as silicon dioxide, for example, that is deposited by atomic layer deposition (ALD).

Figure 4D:
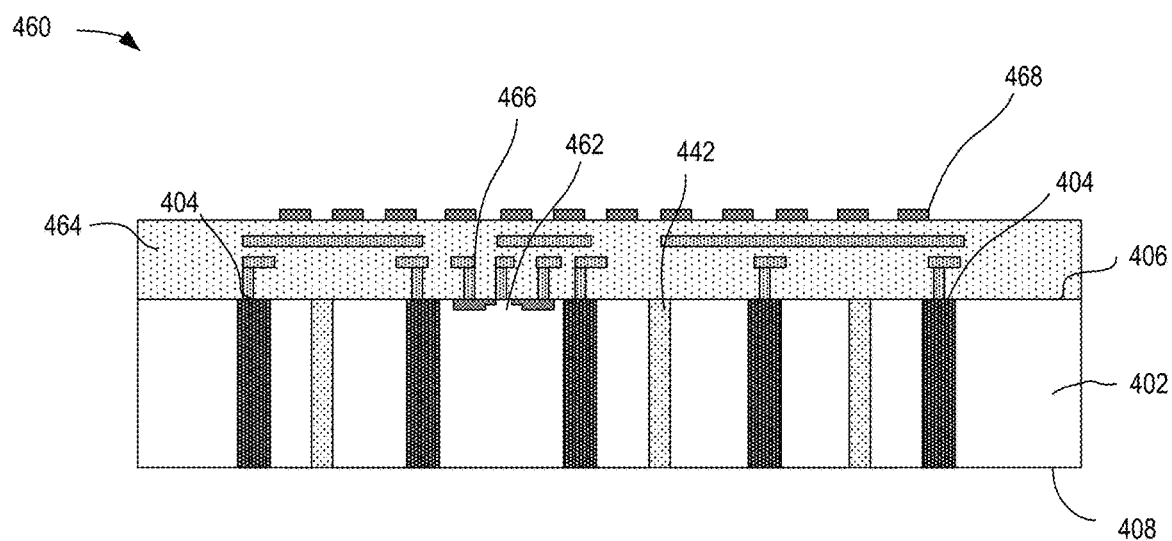

Turning now to FIG. 4D, assembly 460 may include features formed on interposer substrate top surface 406. In some embodiments, transistor 462 may be formed on interposer substrate top surface 406. Transistor 462 may include a source region and a drain region formed by doping or replacing semiconductor material of interposer substrate 402. Also, additional active and/or passive devices may be formed on or over interposer substrate top surface 406 as part of a build-up process.

Interconnects 466 may include metal traces formed in multiple layers, surrounded by interlayer dielectric 464, to couple vias 404 with device contacts 468, for example. In some embodiments, interlayer dielectric 464 may include silicon dioxide, with or without dopants, such as fluorine or carbon.

Figure 4E:
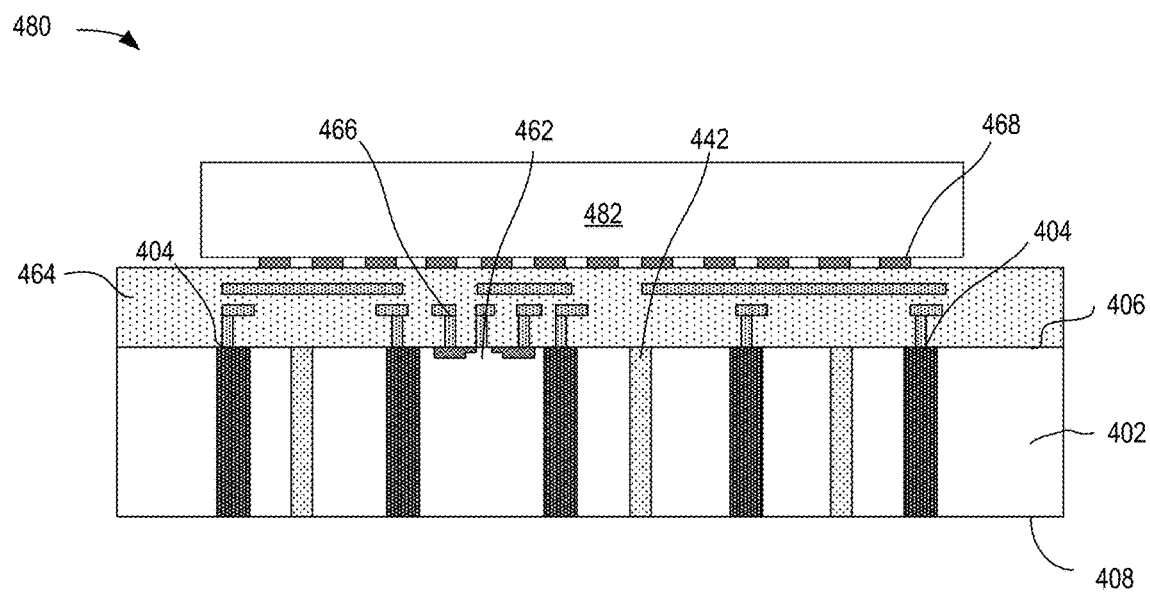

FIG. 4E shows assembly 480, which may have integrated circuit device 482 coupled with device contacts 468. In some embodiments, integrated circuit device 482 may be a processor, controller, memory, or other integrated circuit device. While shown as including a single integrated circuit device 482, in some embodiments multiple integrated circuit devices may be stacked horizontally and/or vertically on the interposer.

Figure 4F:
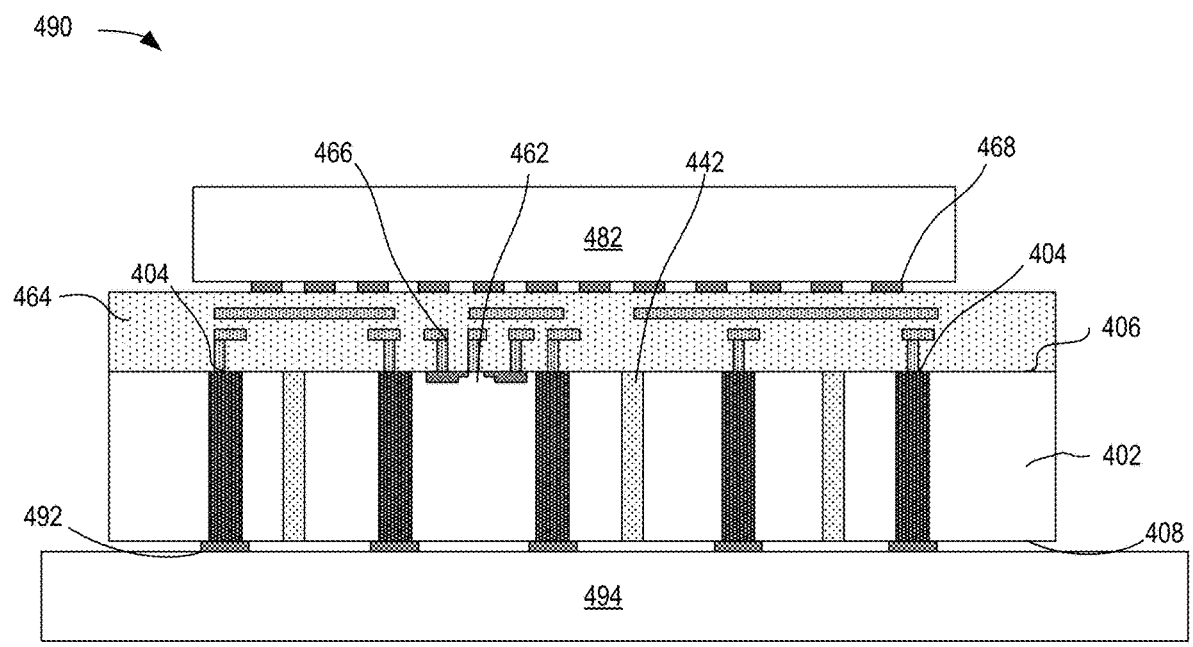

As shown in FIG. 4F, for assembly 490 interposer contacts 492 may be formed on interposer substrate bottom surface 408. In some embodiments, integrated substrate 402 may be ground back or reduced at interposer substrate bottom surface 408, if necessary, to expose vias 404 for coupling with interposer contacts 492. In some embodiments, interposer contacts 492 may be coupled with a package substrate 494. In some embodiments, package substrate 494 may represent a rigid, or semi-rigid material, such as fiberglass, for example, including conductive routing to fanout interposer contacts 492 for coupling with a system board.

Figure 5A:
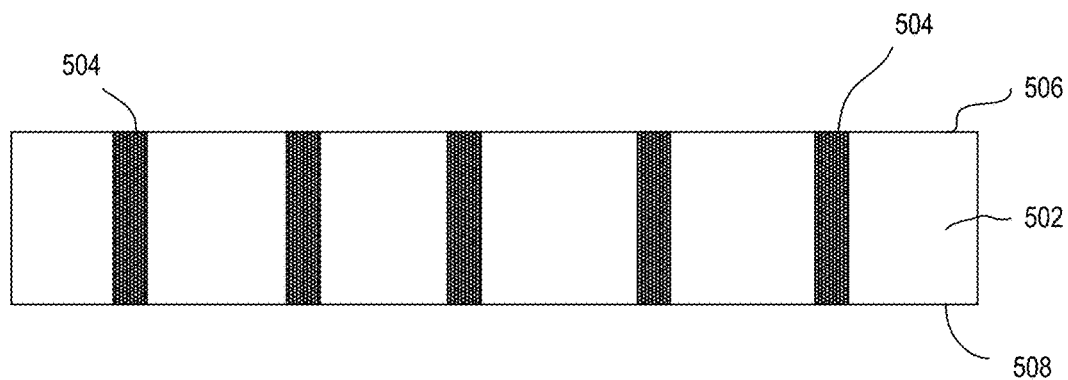
FIGS. 5A-5F illustrate cross-sectional views of manufacturing steps of another example integrated circuit device package including dielectric-filled trench isolation of vias, according to some embodiments.

FIGS. 5A-5F illustrate cross-sectional views of manufacturing steps of another example integrated circuit device package including dielectric-filled trench isolation of vias, according to some embodiments. As shown in FIG. 5A, assembly 500 includes interposer substrate 502, vias 504, interposer substrate top surface 506, and interposer substrate bottom surface 508. In some embodiments, interposer substrate 502 is made from silicon, germanium, or other crystalline material. In some embodiments, vias 504 may be formed by any known technique, including, but not limited to, laser drilling. Also, in addition to conductive material, vias 504 may include additional layers not shown, such as a dielectric liner, for example. While shown as extending from interposer substrate top surface 506 to interposer substrate bottom surface 508, in some embodiments, vias 504 don't initially extend so far and are exposed to the surfaces at a later processing step.

Figure 5B:
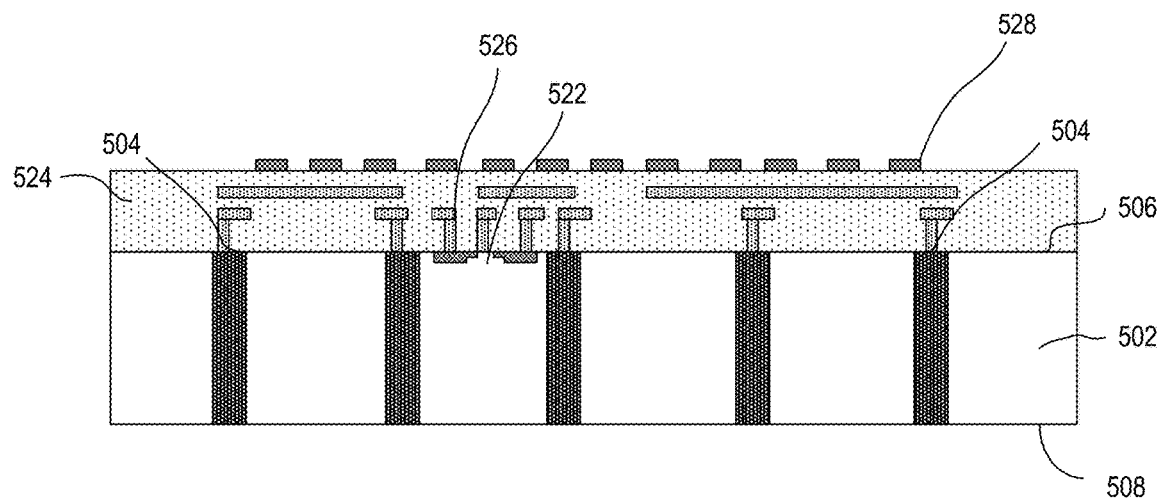

FIG. 5B shows assembly 520, may include features formed on interposer substrate top surface 506. In some embodiments, transistor 522 may be formed on interposer substrate top surface 506. Transistor 522 may include a source region and a drain region formed by doping or replacing semiconductor material of interposer substrate 502. Also, additional active and/or passive devices may be formed on or over interposer substrate top surface 506 as part of a build-up process.

Interconnects 526 may include metal traces formed in multiple layers, surrounded by interlayer dielectric 524, to couple vias 504 with device contacts 528, for example. In some embodiments, interlayer dielectric 524 may include silicon dioxide, with or without dopants, such as fluorine or carbon.

Figure 5C:
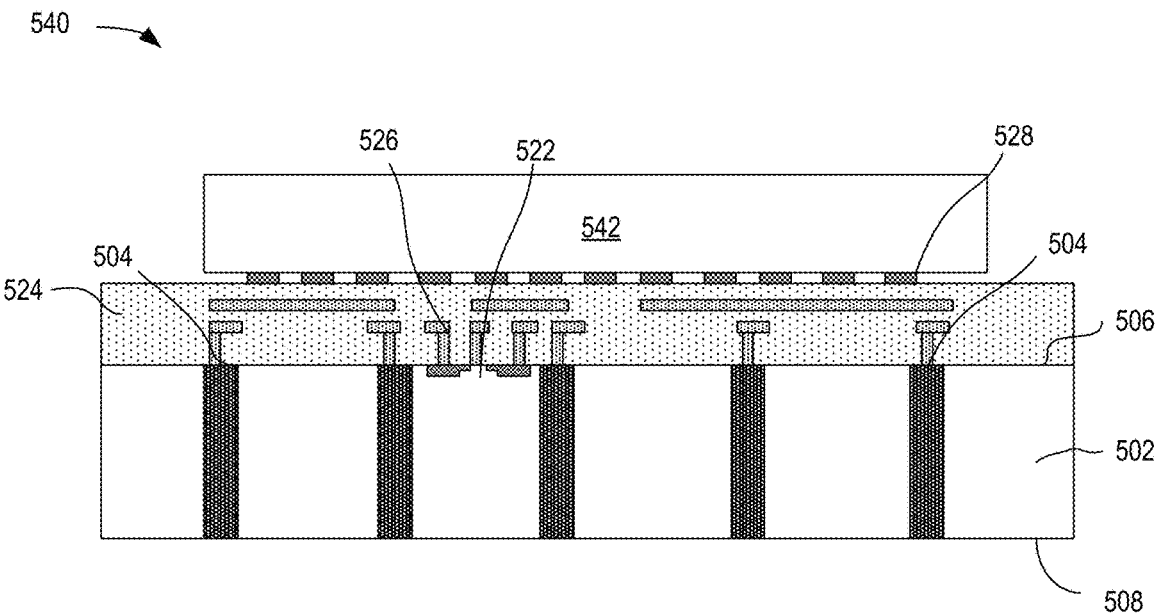

As shown in FIG. 5C, assembly 540 may have integrated circuit device 542 coupled with device contacts 528. In some embodiments, integrated circuit device 542 may be a processor, controller, memory, or other integrated circuit device. While shown as including a single integrated circuit device 542, in some embodiments multiple integrated circuit devices may be stacked horizontally and/or vertically on the interposer.

Figure 5D:
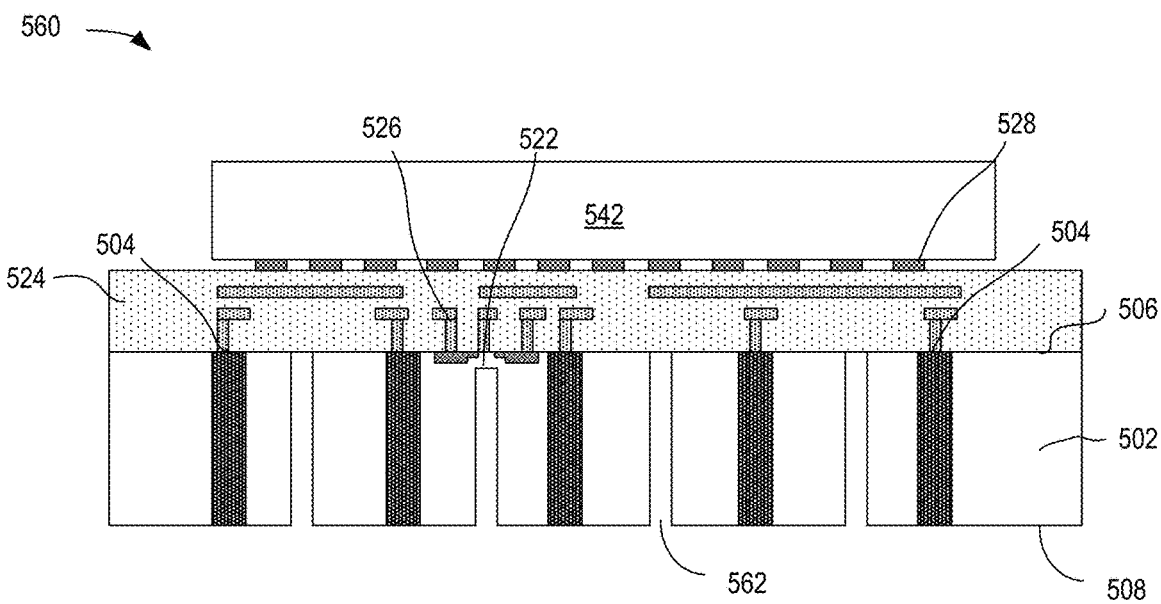

Turning now to FIG. 5D, assembly 560 may include trenches 562 formed into (and in some embodiments through) interposer substrate 502 between vias 504. In some embodiments, one or more trenches 562 may be equidistant from adjacent vias 504, while other trenches 562 may be more proximate to one via 504 than an adjacent via 504. Trenches 562 may be formed by any known technique, including, but not limited to, laser or chemical ablation. In some embodiments, some trenches 562 extend from interposer substrate bottom surface 508 to interposer substrate top surface 506 while other trenches 562 extend from interposer substrate bottom surface 508 to adjacent an active or passive device, such as transistor 522, on interposer substrate top surface 506.

Figure 5E:
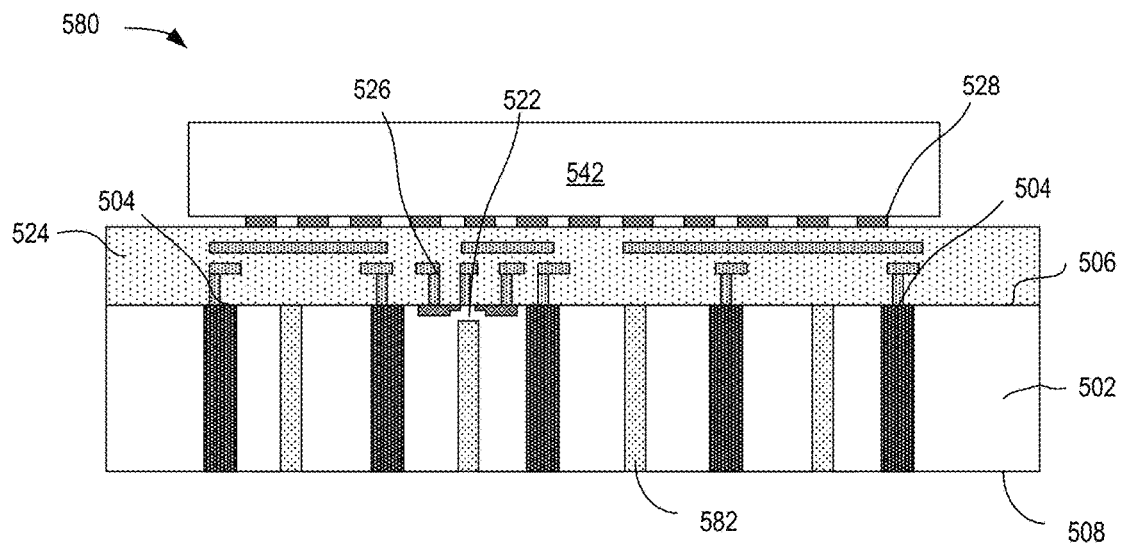

FIG. 5E shows assembly 580, which may have may have had trenches 562 filled with dielectric material 582. In some embodiments, dielectric material 582 may be polymer, including, but not limited to, a polyvinylchloride, polyethylene oxide, or polyethylene terephthalate, that is dispensed as a liquid and subsequently cured. In some embodiments, dielectric material 582 may be a compound, such as silicon dioxide, for example, that is deposited by atomic layer deposition (ALD).

Figure 5F:
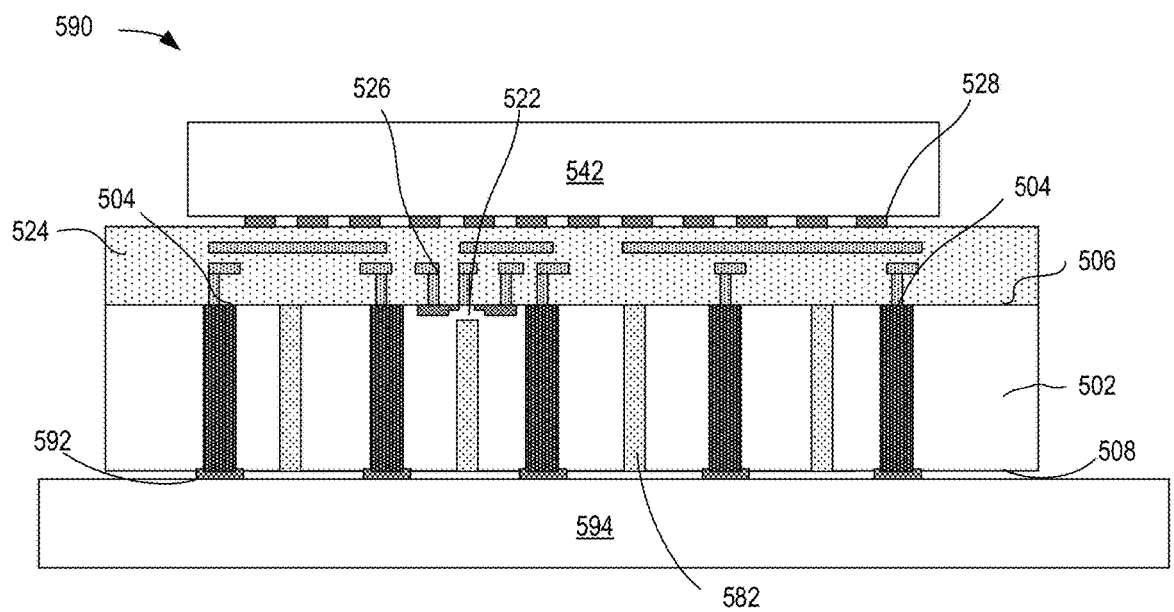

As shown in FIG. 5F, for assembly 590 interposer contacts 592 may be formed on interposer substrate bottom surface 508. In some embodiments, integrated substrate 502 may be ground back or reduced at interposer substrate bottom surface 508, if necessary, to expose vias 504 for coupling with interposer contacts 592. In some embodiments, interposer contacts 592 may be coupled with a package substrate 594. In some embodiments, package substrate 594 may represent a rigid, or semi-rigid material, such as fiberglass, for example, including conductive routing to fanout interposer contacts 592 for coupling with a system board.

Figure 6:
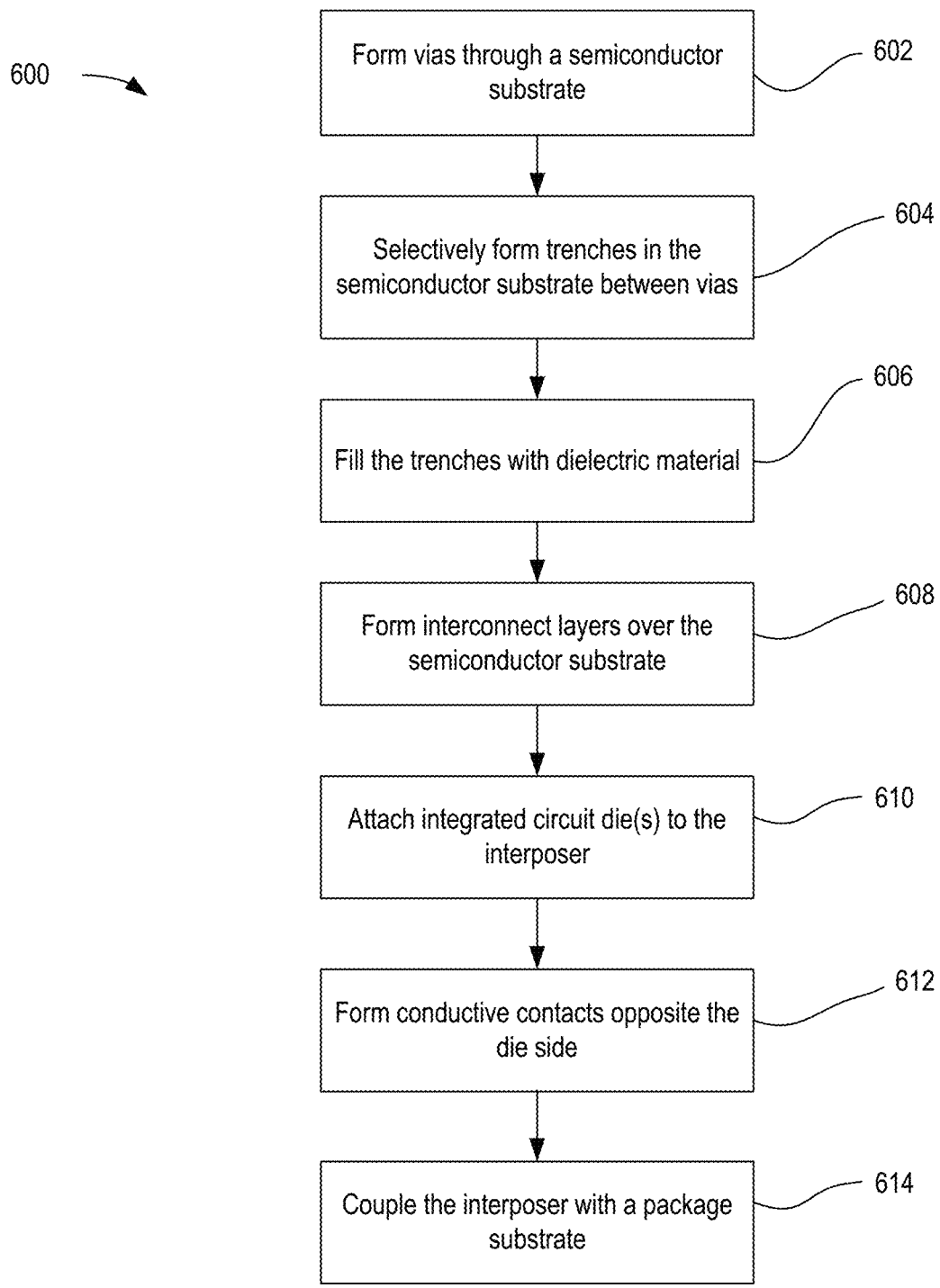
FIG. 6 illustrates a flowchart of an example method of forming an integrated circuit device package including dielectric-filled trench isolation of vias, in accordance with some embodiments.

FIG. 6 illustrates a flowchart of an example method of forming an integrated circuit device package including dielectric-filled trench isolation of vias, in accordance with some embodiments. Although the blocks in the flowchart with reference to FIG. 6 are shown in a particular order, the order of the actions can be modified. Thus, the illustrated embodiments can be performed in a different order, and some actions/blocks may be performed in parallel. Some of the blocks and/or operations listed in FIG. 6 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 600 begins with forming (602) vias through a semiconductor substrate. In some embodiments, interposer substrate 402 may be silicon, germanium, or other crystalline material and may include any number of vias 404. Vias 404 may be formed by any known technique, including, but not limited to, laser drilling. Next, trenches are selectively formed (604) in the semiconductor substrate between the vias. In some embodiments, trenches 422 may include any combination of straight and curved trenches, for example as depicted in FIG. 3, to isolate individual or multiple vias. In some embodiments, trenches 422 may extend fully or only partially though interposer substrate 402.

Then, the trenches may be filled (606) with dielectric material. In some embodiments, dielectric 442 is dispensed as a liquid, for example a polymer resin, that is then cured through heat, UV light exposure, or air exposure, for example. In some embodiments, dielectric 442 may include materials, such as semiconductor alloys that are deposited by any known technique, for example atomic layer deposition. Next, interconnect layers may be formed (608) over the semiconductor substrate. In some embodiments, transistors 462 or other active or passive devices may be formed on interposer substrate top surface 406. In some embodiments, interconnects 466 may be formed in multiple layers surrounded by interlayer dielectric 464 to couple vias 404 with die contacts 468.

The method continues with attaching (610) integrated circuit die(s) to the interposer. In some embodiments, integrated circuit die 482 may be a system on chip (SOC) or a combination of stacked devices. Next, conductive contacts may be formed (612) opposite the die side. In some embodiments, interposer contacts 492 may be C4 bumps or other contacts.

Finally, the interposer may be coupled (614) with a package substrate. In some embodiments, package substrate 494 may provide the device package with mechanical stiffness and fanout routing to transpose a contact pitch from a relatively fine pitch to a relatively coarser pitch.

Figure 7:
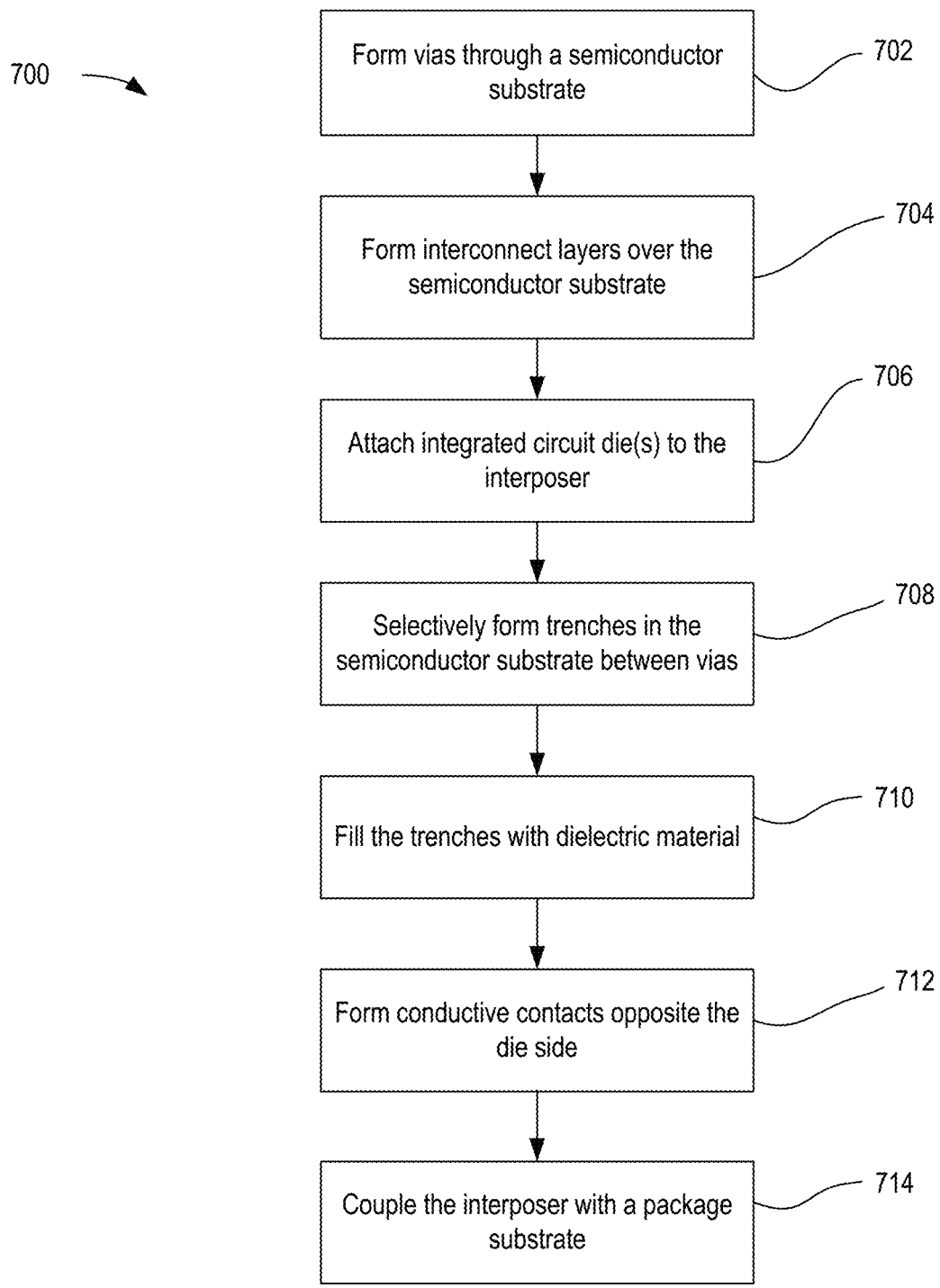
FIG. 7 illustrates a flowchart of another example method of forming an integrated circuit device package including dielectric-filled trench isolation of vias, in accordance with some embodiments.

FIG. 7 illustrates a flowchart of another example method of forming an integrated circuit device package including dielectric-filled trench isolation of vias, in accordance with some embodiments. Although the blocks in the flowchart with reference to FIG. 7 are shown in a particular order, the order of the actions can be modified. Thus, the illustrated embodiments can be performed in a different order, and some actions/blocks may be performed in parallel. Some of the blocks and/or operations listed in FIG. 7 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 700 begins with forming (702) vias through a semiconductor substrate. In some embodiments, interposer substrate 502 may be silicon, germanium, or other crystalline material and may include any number of vias 504. Vias 504 may be formed by any known technique, including, but not limited to, laser drilling. Next, interconnect layers may be formed (704) over the semiconductor substrate. In some embodiments, transistors 522 or other active or passive devices may be formed on interposer substrate top surface 506. In some embodiments, interconnects 526 may be formed in multiple layers surrounded by interlayer dielectric 524 to couple vias 504 with die contacts 528.

The method continues with attaching (706) integrated circuit die(s) to the interposer. In some embodiments, integrated circuit die 542 may be a system on chip (SOC) or a combination of stacked devices. Next, trenches are selectively formed (708) in the semiconductor substrate between the vias. In some embodiments, trenches 562 may include any combination of straight and curved trenches, for example as depicted in FIG. 3, to isolate individual or multiple vias. In some embodiments, trenches 562 may extend fully or only partially though interposer substrate 502.

Then, the trenches may be filled (710) with dielectric material. In some embodiments, dielectric 582 is dispensed as a liquid, for example a polymer resin, that is then cured through heat, UV light exposure, or air exposure, for example. In some embodiments, dielectric 582 may include materials, such as semiconductor alloys that are deposited by any known technique, for example atomic layer deposition. Next, conductive contacts may be formed (712) opposite the die side. In some embodiments, interposer contacts 592 may be C4 bumps or other contacts.

Finally, the interposer may be coupled (714) with a package substrate. In some embodiments, package substrate 594 may provide the device package with mechanical stiffness and fanout routing to transpose a contact pitch from a relatively fine pitch to a relatively coarser pitch.

Figure 8:
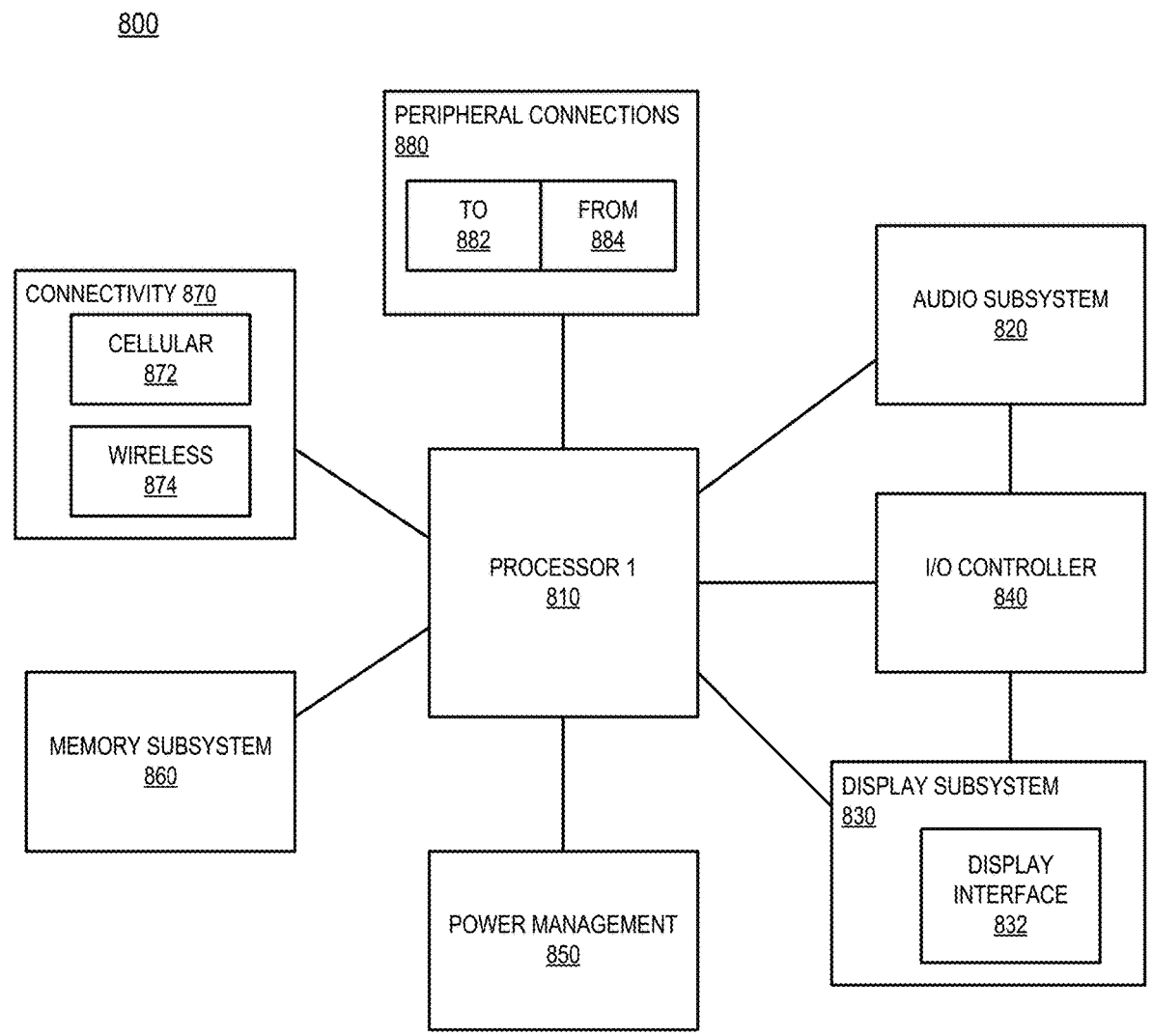
FIG. 8 illustrates a smart device or a computer system or a SoC (System-on-Chip) which includes an integrated circuit device package including dielectric-filled trench isolation of vias, according to some embodiments.

FIG. 8 illustrates a smart device or a computer system or a SoC (System-on-Chip) 800 which includes an integrated circuit device package including dielectric-filled trench isolation of vias, according to some embodiments. In some embodiments, computing device 800 represents a mobile computing device, such as a computing tablet, a mobile phone or smart-phone, a wireless-enabled e-reader, or other wireless mobile device. It will be understood that certain components are shown generally, and not all components of such a device are shown in computing device 800. In some embodiments, one or more components of computing device 800, for example processor 810 and/or memory subsystem 860, include dielectric-filled trench isolation of vias as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 800 includes a first processor 810. The various embodiments of the present disclosure may also comprise a network interface within 870 such as a wireless interface so that a system embodiment may be incorporated into a wireless device, for example, cell phone or personal digital assistant.

In one embodiment, processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting the computing device 800 to another device. The processing operations may also include operations related to audio I/O and/or display I/O.

In one embodiment, computing device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 800, or connected to the computing device 800. In one embodiment, a user interacts with the computing device 800 by providing audio commands that are received and processed by processor 810.

Display subsystem 830 represents hardware (e.g., display devices) and software (e.g., drivers) components that provide a visual and/or tactile display for a user to interact with the computing device 800. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touch screen (or touch pad) device that provides both output and input to a user.

I/O controller 840 represents hardware devices and software components related to interaction with a user. I/O controller 840 is operable to manage hardware that is part of audio subsystem 820 and/or display subsystem 830. Additionally, I/O controller 840 illustrates a connection point for additional devices that connect to computing device 800 through which a user might interact with the system. For example, devices that can be attached to the computing device 800 might include microphone devices, speaker or stereo systems, video systems or other display devices, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of the computing device 800. Additionally, audio output can be provided instead of, or in addition to display output. In another example, if display subsystem 830 includes a touch screen, the display device also acts as an input device, which can be at least partially managed by I/O controller 840. There can also be additional buttons or switches on the computing device 800 to provide I/O functions managed by I/O controller 840.

In one embodiment, I/O controller 840 manages devices such as accelerometers, cameras, light sensors or other environmental sensors, or other hardware that can be included in the computing device 800. The input can be part of direct user interaction, as well as providing environmental input to the system to influence its operations (such as filtering for noise, adjusting displays for brightness detection, applying a flash for a camera, or other features).

In one embodiment, computing device 800 includes power management 850 that manages battery power usage, charging of the battery, and features related to power saving operation. Memory subsystem 860 includes memory devices for storing information in computing device 800. Memory can include nonvolatile (state does not change if power to the memory device is interrupted) and/or volatile (state is indeterminate if power to the memory device is interrupted) memory devices. Memory subsystem 860 can store application data, user data, music, photos, documents, or other data, as well as system data (whether long-term or temporary) related to the execution of the applications and functions of the computing device 800.

Elements of embodiments are also provided as a machine-readable medium (e.g., memory 860) for storing the computer-executable instructions. The machine-readable medium (e.g., memory 860) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 870 includes hardware devices (e.g., wireless and/or wired connectors and communication hardware) and software components (e.g., drivers, protocol stacks) to enable the computing device 800 to communicate with external devices. The computing device 800 could be separate devices, such as other computing devices, wireless access points or base stations, as well as peripherals such as headsets, printers, or other devices.

Connectivity 870 can include multiple different types of connectivity. To generalize, the computing device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 874 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 880 include hardware interfaces and connectors, as well as software components (e.g., drivers, protocol stacks) to make peripheral connections. It will be understood that the computing device 800 could both be a peripheral device ("to" 882) to other computing devices, as well as have peripheral devices ("from" 884) connected to it. The computing device 800 commonly has a "docking" connector to connect to other computing devices for purposes such as managing (e.g., downloading and/or uploading, changing, synchronizing) content on computing device 800. Additionally, a docking connector can allow computing device 800 to connect to certain peripherals that allow the computing device 800 to control content output, for example, to audiovisual or other systems.

In addition to a proprietary docking connector or other proprietary connection hardware, the computing device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an apparatus is provided comprising: a substrate, the substrate comprising crystalline material; a first set of one or more contacts on a first substrate surface; a second set of one or more contacts on a second substrate surface, the second substrate surface opposite the first substrate surface; a first via through the substrate coupled with a first one of the first set of contacts and with a first one of the second set of contacts; a second via through the substrate coupled with a second one of the first set of contacts and with a second one of the second set of contacts; a trench in the substrate from the first substrate surface toward the second substrate surface, wherein the trench is apart from, and between, the first via and the second via; and dielectric material filling the trench.

In some embodiments, the trench surrounds the first via. In some embodiments, the trench comprises a circular, rectangular, or oval profile. In some embodiments, the trench is concentric with the first via. In some embodiments, the trench separates a first region of the substrate and a second region of the substrate, wherein the first via is one of a plurality of vias in the first region and wherein the second via is one of a plurality of vias in the second region. Some embodiments also include a second trench in the first region of the substrate between the first via and one other of the plurality of vias in the first region. In some embodiments, the plurality of vias in the second region are not separated from one another by a trench. In some embodiments, the crystalline material comprises silicon. In some embodiments, the dielectric material comprises a polymer. In some embodiments, the trench comprises a width of about 10 micrometers.

In another example, an integrated circuit device package is provided comprising: an integrated circuit die; a package substrate; and an interposer coupled between the integrated circuit die and the package substrate, wherein the interposer comprises: a substrate, the substrate comprising semiconductor material; a first set of one or more contacts on a first substrate surface; a second set of one or more contacts on a second substrate surface, the second substrate surface opposite the first substrate surface; a first via through the substrate coupled with a first one of the first set of contacts and with a first one of the second set of contacts; a second via through the substrate coupled with a second one of the first set of contacts and with a second one of the second set of contacts; and a trench in the substrate from the first substrate surface toward the second substrate surface, wherein the trench is apart from, and between, the first via and the second via; and dielectric material filling the trench.

In some embodiments, the trench extends to the second substrate surface. In some embodiments, the trench extends to adjacent a transistor on the second substrate surface. In some embodiments, the trench separates a first region of the substrate and a second region of the substrate, wherein the first via is one of a plurality of vias in the first region and wherein the second via is one of a plurality of vias in the second region. Some embodiments also include a second trench in the first region of the substrate between the first via and one other of the plurality of vias in the first region. In some embodiments, the semiconductor material comprises silicon. In some embodiments, the dielectric material comprises a polymer.

In another example, a system is provided comprising: a processor; a communication interface; and an integrated circuit device package coupled with the processor and the communication interface wherein the integrated circuit device package comprises: an integrated circuit die; a package substrate; and an interposer coupled between the integrated circuit die and the package substrate, wherein the interposer comprises: a substrate, the substrate comprising semiconductor material; a first set of one or more contacts on a first substrate surface; a second set of one or more contacts on a second substrate surface, the second substrate surface opposite the first substrate surface; a first via through the substrate coupled with a first one of the first set of contacts and with a first one of the second set of contacts; a second via through the substrate coupled with a second one of the first set of contacts and with a second one of the second set of contacts; and a trench in the substrate from the first substrate surface toward the second substrate surface, wherein the trench is apart from, and between, the first via and the second via; and polymer material filling the trench.

In some embodiments, the trench extends to the second substrate surface. In some embodiments, the trench extends to adjacent a transistor on the second substrate surface. In some embodiments, the trench separates a first region of the substrate and a second region of the substrate, wherein the first via is one of a plurality of vias in the first region and wherein the second via is one of a plurality of vias in the second region. Some embodiments also include a second trench in the first region of the substrate between the first via and one other of the plurality of vias in the first region. In some embodiments, the trench extends laterally from a third substrate surface toward a fourth substrate surface. In some embodiments, the trench extends to the fourth substrate surface. In some embodiments, the semiconductor material comprises silicon.

In another example, a method is provided comprising: forming a first via through a semiconductor substrate; forming a second via through the semiconductor substrate; forming a trench in the semiconductor substrate from a first semiconductor substrate surface toward a second semiconductor substrate surface, wherein the trench is apart from, and between, the first via and the second via; and filling the trench with dielectric material.

In some embodiments, the trench surrounds the first via. In some embodiments, filling the trench with dielectric material comprises flowing a polymer into the trench. In some embodiments, the trench separates a first region of the substrate and a second region of the substrate, wherein the first via is one of a plurality of vias in the first region and wherein the second via is one of a plurality of vias in the second region. Some embodiments also include forming a second trench in the first region of the substrate between the first via and one other of the plurality of vias in the first region. Some embodiments also include forming the trench to the second semiconductor substrate surface. Some embodiments also include forming the trench to adjacent a transistor on the second semiconductor substrate surface. In some embodiments, forming the trench comprises laser ablation.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a substrate, the substrate comprising crystalline material;
a first set of one or more contacts on a first substrate surface;
a second set of one or more contacts on a second substrate surface, the second substrate surface opposite the first substrate surface;
a first via through the substrate coupled with a first one of the first set of contacts and with a first one of the second set of contacts;
a second via through the substrate coupled with a second one of the first set of contacts and with a second one of the second set of contacts;
a trench in the substrate from the first substrate surface toward the second substrate surface, wherein the trench is spaced within the substrate apart from, and between, the first via and the second via; and
dielectric material filling the trench.

2. The apparatus of claim 1, wherein the trench surrounds the first via.

3. The apparatus of claim 2, wherein the trench comprises a circular, rectangular, or oval profile.

4. The apparatus of claim 2, wherein the trench is concentric with the first via.

5. The apparatus of claim 1, wherein the trench separates a first region of the substrate and a second region of the substrate, wherein the first via is one of a plurality of vias in the first region and wherein the second via is one of a plurality of vias in the second region.

6. The apparatus of claim 5, further comprising a second trench in the first region of the substrate between the first via and one other of the plurality of vias in the first region.

7. The apparatus of claim 6, wherein the plurality of vias in the second region are not separated from one another by a trench.

8. The apparatus of claim 6, wherein the crystalline material comprises silicon.

9. The apparatus of claim 6, wherein the dielectric material comprises a polymer.

10. The apparatus of claim 6, wherein the trench comprises a width of about 10 micrometers.

* * * * *